United States Patent
Tichauer (12)

(10) Patent No.: US 6,410,970 B1
(45) Date of Patent: Jun. 25, 2002

(54) SEMICONDUCTOR DEVICE HAVING A P-N JUNCTION WITH A PHOTOSENSITIVE REGION

(75) Inventor: Larry M. Tichauer, La Palma, CA (US)

(73) Assignee: Ophir RF, Inc., Los Angeles, CA (US)

( * ) Notice: Subject to any disclaimer, the term of this patent is extended or adjusted under 35 U.S.C. 154(b) by 0 days.

(21) Appl. No.: 09/532,581

(22) Filed: Mar. 22, 2000

(51) Int. Cl.[7] ............................................. H01L 31/105
(52) U.S. Cl. ...................... 257/458; 257/113; 257/257; 257/431; 257/461; 257/462
(58) Field of Search ................. 257/113, 257, 257/462, 431, 461, 458; 250/210, 338.4

(56) References Cited

U.S. PATENT DOCUMENTS

| | | | | |
|---|---|---|---|---|
| 4,107,721 A | * | 8/1978 | Miller | .......................... 357/30 |
| 4,651,180 A | * | 3/1987 | Nishikawa et al. | ........... 357/22 |
| 5,739,561 A | * | 4/1998 | Wennekers | .................. 257/257 |
| 6,285,040 B1 | * | 9/2001 | Sanada | ........................ 257/48 |

* cited by examiner

Primary Examiner—Eddie Lee
Assistant Examiner—N. Drew Richards
(74) Attorney, Agent, or Firm—Blakely, Sokoloff, Taylor & Zafman LLP

(57) ABSTRACT

A semiconductor device that has a p-n junction with a photosensitive region partially having a diffusion region and a non-diffused region when the p-n junction is subjected to a reverse bias voltage. When an incident light (e.g. a laser) is directed at the surface of the photosensitive region, hole-electron pairs are generated in the partial diffusion region within the photosensitive region. As a result, the current through the photosensitive region changes in a substantially linear fashion with the intensity of the incident light. The semiconductor device can be configured in a circuit to provide substantially linear power amplification.

30 Claims, 2 Drawing Sheets

SEMICONDUCTOR DEVICE HAVING A P-N JUNCTION WITH A PHOTOSENSITIVE REGION

FIELD OF THE INVENTION

This invention relates generally to semiconductor devices, and in particular, a semiconductor device having a p-n junction with a photosensitive region that can be modulated with an optical source to generate hole-electron pairs from a partial depletion region formed within the photosensitive region when the p-n junction is subjected to a reverse bias voltage. The generation of hole electron pairs in the photosensitive region causes current to flow between the p-n junction. The semiconductor device is particularly useful for power amplification, and has improved linearity.

BACKGROUND OF THE INVENTION

Linearity in radio frequency (RF)/microwave power amplifiers is an important characteristic in the design of these devices. Poor linearity in power amplifiers can have many adverse effects. For instance, poor linearity can result in harmonic, intermodulation, and signal compression distortions, to name a few. Thus, designers of power amplifiers continue to develop new techniques for improving the linear characteristic of power amplifiers.

Traditionally, two types of field effect transistors have been used for RF/microwave power amplifications. These are the metal-oxide semiconductor field effect transistor (MOSFET) and the gallium-arsenide field effect transistor (GaAs FET). MOSFETs are used in power amplification purposes because they are typically easier to manufacturer and are less expensive. However, they have poor linear characteristics which requires linearization compensation which adds to the cost and efficiency of the overall product. GaAs FETs, on the other hand, are more frequently employed for RF/microwave power amplification applications due to their improved linearity characteristic over MOSFETs. However, they are typically expensive clue to complexity in their manufacturing processes.

Thus, there is a need for a new semiconductor device that uses MOSFET technology for manufacturing purposes in order to reduce cost, but has improved linearity such as that provided by GaAs FETs.

SUMMARY OF THE INVENTION

One aspect of the invention includes a semiconductor device that has a p-n junction with a photosensitive region partially having a diffusion region and a non-diffused region when the p-n junction is subjected to a reverse bias voltage. When an incident light (e.g. a laser) is directed at the surface of the photosensitive region, hole-electron pairs are generated from the partial diffusion region within the photosensitive region. As a result, the current through photosensitive region occurs which varies in a substantially linear fashion with the intensity of the incident light. The semiconductor device can be configured in a circuit to provide substantially linear power amplification.

A more specific exemplary embodiment of the semiconductor device comprises a substrate, n-doped and p-doped regions within the substrate, and a channel formed between the n-doped and p-doped regions. As with all p-n junction, a depletion region exists within the channel when a reverse bias voltage is applied across the p-n junction. The semiconductor device further includes a photosensitive region situated within the channel in a manner that it includes a boundary of the depletion region when the reverse bias voltage is applied across the p-n junction. The partial depletion region within the photosensitive region generates hole-electron pairs in response to an incident light upon the photosensitive region.

A more broader concept of the invention includes a semiconductor device having a substrate including a channel for conduction of current, wherein the channel includes a depletion region during the conduction of current, a photosensitive region situated within the channel in a manner that it includes a boundary of the depletion region during the conduction of current. Hole-electron pairs are generated from the partial depletion region within the photosensitive region in response to an incident light upon the photosensitive region. The device need not be limited to reverse bias diode configuration, and can encompass other configurations.

Another aspect of the invention includes an amplifier that uses the semiconductor device of the invention. The amplifier comprises a modulator for modulating a light with an input signal and a semiconductor device in accordance with the invention. The semiconductor device receives the modulated light signal which modulates the current through the semiconductor device. The semiconductor device is connected across a bias voltage with a series bias impedance to generate current through the semiconductor device. The current generates an output voltage that is an amplified version of the input signal.

Another aspect of the invention includes a complimentary device having a p-channel photosensitive semiconductor device in accordance with the invention and an n-channel photosensitive semiconductor device in accordance with the invention. An optic fiber channel is provided to couple an optical signal to respective photosensitive regions of the p-channel and n-channel devices. The p-doped region of the p-channel device and the n-doped region of the n-channel device are electrically coupled to the same potential, preferably a ground potential. The p-channel device is biased with a positive voltage (+Vd) through a series resistive element, and the n-channel device is biased with a negative voltage (-Vd) also through a series impedance element. When an optical signal is applied to the complimentary devices by way of the optical fibre or lens, the complimentary devices operate in a push-pull manner. The complimentary devices can be used for many applications.

Other aspects of the invention will become apparent in view of the following detailed discussion of the invention.

DETAILED DESCRIPTION OF THE INVENTION

The general concept regarding the invention is a semiconductor device that has a p-n junction with a photosensitive region partially having a diffusion region and a non-diffused region when the p-n junction is subjected to a reverse bias voltage. When an incident light (e.g. a laser) is directed at the surface of the photosensitive region, hole-electron pairs proportional to the amount of light impinging the photosensitive region are generated. As a result, the current through the photosensitive region changes in a substantially linear fashion with the intensity of the incident light.

The linearity characteristic of this semiconductor device comes about because the diffusion region other than within the photosensitive region is saturated. Thus, as the voltage across the p-n junction varies, the resistance of the channel insubstantially varies. Therefore, most of the variations of the channel resistance comes from the hole-electron pairs generated within the photosensitive region. In other words, the device acts like a saturated transistor with a beta approximately one (1). Because of the improved linearity of the semiconductor device, the device can be configured in a circuit to provide substantially linear power amplification.

Figure 1:
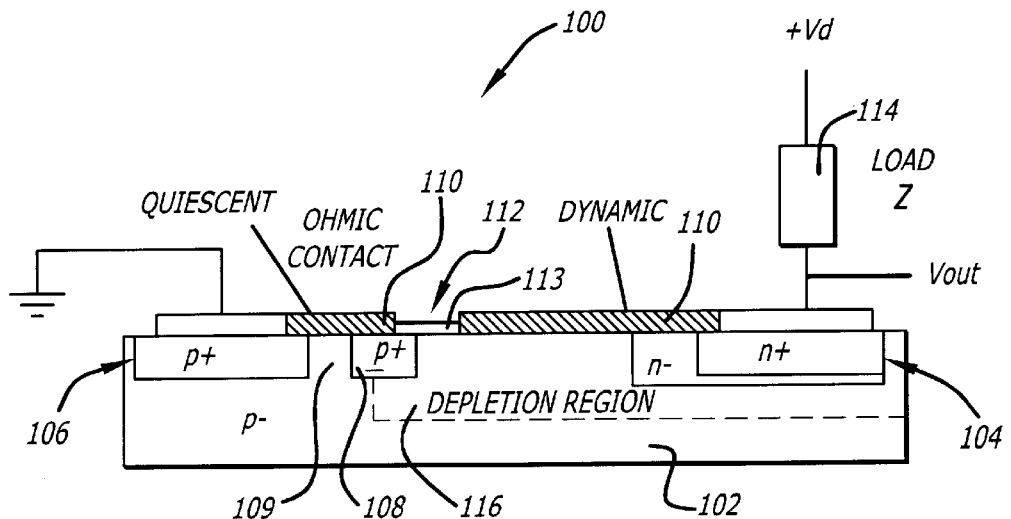
FIG. 1 illustrates a side sectional view of an exemplary semiconductor device in accordance with the invention.

FIG. 1 illustrates a side sectional view of an exemplary semiconductor device 100 in accordance with the invention. The semiconductor device 100 comprises a substrate 102. In the example semiconductor device illustrated, the substrate 102 has a relatively low p-doping (p−). An n-doped region 104, preferably comprising a relatively high doping (n+) and a relatively low doping region (n−), is formed within the substrate 102. Additionally, a relatively high p-doped region (p+) 106 is also formed within the substrate 102, spaced apart from the n-doped region 104. Interposed between the n-doped region 104 and the p-doped region 106 is a photosensitive material 108, which is preferably a relatively high-doped region (p+). The photosensitive region (p+) 108 is situated closer to the p-doped region (p+), but spaced apart therefrom to define a resistive region 109 between the photosensitive region 108 and the n-doped region.

The semiconductor device 100 further includes ohmic contacts on the surface of the substrate 102 for electrical connection to the n-doped 104 and p-doped regions 106. The semiconductor device 100 may also include optically reflective material 110 disposed on the surface of the substrate 102 with an opening 112 situated to allow an incident light to strike the photosensitive region (p+) 108. The reflective material 110 masks most of the p-n junction from the incident light, except for the photosensitive region (p+) 108. The semiconductor device 100 may further include a silicon nitride layer 113 or other suitable material within the opening 112 to optically impedance match between the silicon substrate 102 and the laser source interface. This can be air if we use a lens to focus or fiber optic/Si. In an exemplary application, the n-doped region 104 is electrically connected to a positive bias voltage (+Vd) by way of a load 114 and the p-doped region 106 is electrically connected to a ground potential (or negative voltage as compared to the positive bias voltage (+Vd)).

As typical of all p-n junctions, a depletion region 116 is formed between the n-doped region 104 and the p-doped region 106. The length of the depletion region depends on the doping concentrations, profiles of the dopants, and the reverse bias voltage (+Vd) applied across the p-n junction. To properly bias the semiconductor device 100, the reverse bias voltage (+Vd) is adjusted so that the depletion region 116 extends partially within the photosensitive region (+Vd) 108. In FIG. 1, the boundary of the depletion region 116 within the photosensitive region (p+) 108 is shown with a dash line.

In operation, when light (e.g. a laser) strikes the photosensitive region (p+) 108, the light energy generates hole-electron pairs from the partial diffusion region within the photosensitive region (p+) 108. The current generated in the photosensitive region in the p-n direction and near the surface of the substrate (where most of the current propagates) changes in proportion and substantially linear with the intensity of the light energy striking the photosensitive region (p+) 108. Thus, the light energy can modulate the current through the semiconductor device 100 between the n-doped region 104 to the p-doped region 106. This characteristic of the semiconductor device 100 makes it particularly useful for signal amplification applications. Because of the linearity of the variation of the current with the light intensity, the semiconductor device 100 is particularly useful for power amplification where substantial linearity is desired. For instance, in the configuration shown in FIG. 1, the output voltage (Vout) varies substantially linear with the light intensity striking the photosensitive region (p+) 108.

Figure 2:
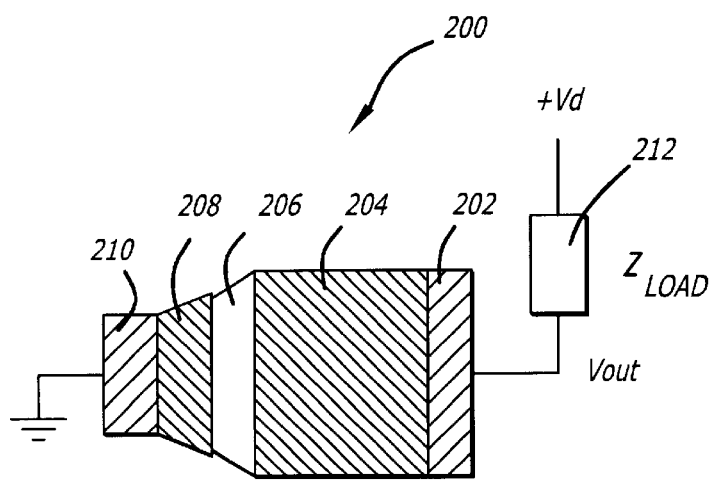
FIG. 2 illustrates a top sectional view of an exemplary semiconductor device in accordance with the invention.

FIG. 2 illustrates a top sectional view of an exemplary semiconductor device 200 in accordance with the invention. The semiconductor device 200 comprises an n-doped region 202, the diffusion region 204, a photosensitive region 206, a substantially constant resistive region 208, and a p-doped region 210. As with the embodiment shown in FIG. 1, the semiconductor device 200 may be connected across a bias voltage (+Vd) with a series impedance 212. For linearity purpose, it is desirable for the voltage reduction of the output voltage Vout to be equal to the voltage reduction across the photosensitive region. (p+) 206 in response to a change in the incident light intensity. However, that would result in half of the desired output power to be dissipated within the channel. To ameliorate this problem, the semiconductor device 200 comprises a tapered channel extending from approximately the n-side of the photosensitive region (p+) 206 to the p-doped region 210. This configuration results in a higher resistance in the resistive region 208 than within the photosensitive region (p+) 206. Thus, the impact of the channel modulation on the output power is reduced.

Another technique to reduce the impact of the channel modulation on the output power is to provide a doping profile that is greater around the photosensitive region (p+) 206 than in the resistive region 208. This results in a higher resistance in the resistive region 208 than in the photosensitive region (p+) 206. Thus, the impact of the channel modulation on the output power is reduced.

Figure 3:
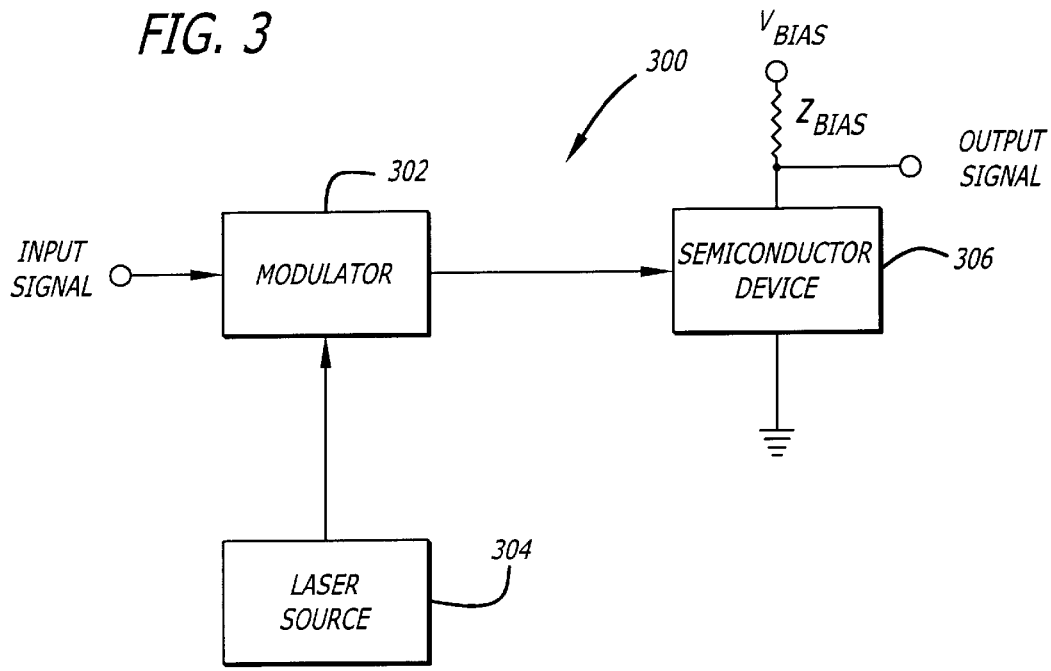
FIG. 3 illustrates a block diagram of an exemplary power amplifier (or stage) using the exemplary semiconductor device in accordance with the invention.

FIG. 3 illustrates a block diagram of an exemplary power amplifier (or stage) 300 in accordance with the invention. The power amplifier 300 comprises a modulator 302 for modulating a laser emitted from a laser source 304 with an input signal. The modulated laser is applied to the semiconductor device 306, such as the exemplary devices 100 and 200, that receives a bias voltage ($V_{bias}$) through a series bias impedance ($Z_{bias}$). The output voltage Vout is taken off the node between the bias impedance ($Z_{bias}$) and the semiconductor device 306. Because of the improved linearity of the semiconductor device 306, the power amplifier 300 consequently also has improved linearity. The power amplifier 300 is merely one application of many for the semiconductor device of the invention.

Figure 4:
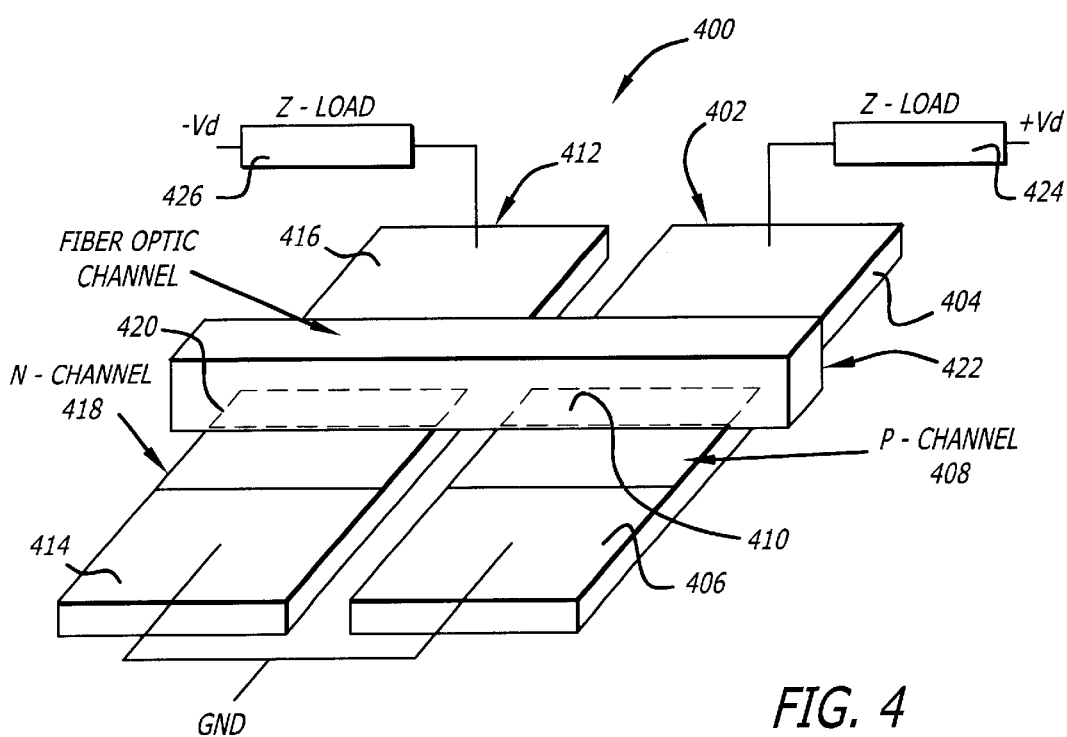
FIG. 4 illustrates a perspective view of exemplary complimentary semiconductor devices in accordance with the invention.

FIG. 4 illustrates a perspective view of exemplary complimentary semiconductor devices 400 in accordance with the invention. The complimentary devices 400 comprises two semiconductor devices, such as semiconductor devices 100 and 200, except that one of the devices is configured with an n-channel instead of a p-channel. More specifically, the complimentary devices 400 comprises a p-channel semiconductor device 402 that includes an n-doped region 404, a p-doped region 406, and a p-doped channel 408 (e.g. formed using a p-doped substrate).

The p-channel semiconductor device 402 further includes a photosensitive region comprising a relatively highly p-doped region 410 situated within the p-doped channel 408. The complimentary devices 400 further comprises an n-channel semiconductor device 412 that includes an n-doped region 414, a p-doped region 416, and an n-doped channel 418 (e.g. formed using an n-doped substrate). The n-channel semiconductor device 412 further includes a photosensitive region comprising a relatively highly n-doped region 420 situated within the n-doped channel 418. An optical fiber 422 coupled to respective photosensitive regions 410 and 420 of the p– and n– devices 402 and 412 may be included to provide a modulated light source to these regions.

The complimentary semiconductor devices 400 are arranged in a push-pull configurations. That is, the p-doped region 406 of the p-channel semiconductor device 402 and the n-doped region 414 of the n-channel semiconductor device 412 are both electrically connected in common to a ground potential. The p-channel semiconductor device 402 is biased with a positive voltage (+Vd) applied to the n-doped region 404 of the semiconductor device 402 by way of a series impedance element 424, and the n-channel semiconductor device 412 is biased with a negative voltage (–Vd) applied to the p-doped region 416 of the semiconductor device 412 by way of a series impedance element 426. An optical signal applied to the complimentary devices 400 through the fiber optic channel will cause a push-pull operations of the complimentary devices 400.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A semiconductor device, comprising:

a substrate;

an n-doped region within said substrate;

a p-doped region within said substrate;

a channel within said substrate between said n-doped and p-doped regions, wherein a depletion region exists within said channel when a reverse bias voltage is applied across said n-doped and p-doped regions; and a photosensitive region doped with p-type dopant, said photosensitive region situated within said channel and partially including said depletion region when said reverse bias voltage is applied across said n-doped and p-doped regions, wherein hole-electron pairs are generated from said partial depletion region within said photosensitive region in response to an incident light upon said photosensitive region, wherein said substrate is doped with p-type dopant, and the concentration of the p-type dopant in the photosensitive region is greater than the concentration of the p-type dopant of the substrate.

2. The semiconductor device of claim 1, wherein said n-doped region comprises a first higher n-doped region and a second lower n-doped region.

3. A semiconductor device, comprising:

a substrate;

an n-doped region within said substrate;

a p-doped region within said substrate;

a channel within said substrate between said n-doped and p-doped regions, wherein a depletion region exists within said channel when a reverse bias voltage is applied across said n-doped and p-doped regions; and a photosensitive region situated within said channel and partially including said depletion region when said reverse bias voltage is applied across said n-doped and p-doped regions, wherein hole-electron pairs are generated from said partial depletion region within said photosensitive region in response to an incident light upon said photosensitive region, wherein said substrate is doped with p-type dopant, and the concentration of the p-type dopant in the p-doped region is greater than the concentration of the p-type dopant of the substrate.

4. The semiconductor device of claim 3, wherein said photosensitive region is doped with a dopant.

5. The semiconductor device of claim 4, wherein said dopant is a p-type dopant.

6. The semiconductor device of claim 3, further including a light reflecting material disposed over said channel, wherein said light reflecting material includes an opening to allow an incident light to strike said photosensitive region.

7. A semiconductor device, comprising:

a substrate;

an n-doped region within said substrate;

a p-doped region within said substrate;

a channel within said substrate between said n-doped and p-doped regions, wherein a depletion region exists within said channel when a reverse bias voltage is applied across said n-doped and p-doped regions; and a photosensitive region situated within said channel and partially including said depletion region when said reverse bias voltage is applied across said n-doped and p-doped regions, wherein hole-electron pairs are generated from said partial depletion region within said photosensitive region in response to an incident light upon said photosensitive region, wherein said photosensitive region is tapered so that the resistance of the photosensitive region increases along the n-doped to p-doped region direction.

8. The semiconductor device of claim 7, further including a substantially constant resistive region within said substrate between said photosensitive region and the p-doped region.

9. A semiconductor device, comprising:

a substrate;

an n-doped region within said substrate;

a p-doped region within said substrate;

a channel within said substrate between said n-doped and p-doped regions, wherein a depletion region exists within said channel when a reverse bias voltage is applied across said n-doped and p-doped regions;

a photosensitive region situated within said channel and partially including said depletion region when said reverse bias voltage is applied across said n-doped and p-doped regions, wherein hole-electron pairs are generated from said partial depletion region within said photosensitive region in response to an incident light upon said photosensitive region; and a substantially constant resistive region within said substrate between said photosensitive region and the p-doped region, wherein said resistive region is tapered so that the resistance of the resistive region increases along the n-doped to p-doped region direction.

10. An amplifier, comprising:
a modulator for modulating a light with an input signal; and
a semiconductor device, comprising:
a substrate;
a n-doped region within said substrate;
a p-doped region within said substrate;
a channel within said substrate between said n-doped and p-doped regions, wherein a depletion region exists within said channel when a reverse bias voltage is applied across said n-doped and p-doped regions; and
a photosensitive region doped with p-type dopant, said photosensitive region situated within said channel and including a portion of said depletion region when said reverse bias voltage is applied across said n-doped and p-doped regions, wherein hole-electron pairs are generated from said depletion region within said photosensitive region in response to said modulated light upon said photosensitive region; and
a series impedance element electrically coupled either to said n-doped region or p-doped region for biasing said semiconductor device, wherein said substrate is doped with p-type dopant, and the concentration of the p-type dopant in the photosensitive region is greater than the concentration of the p-type dopant of the substrate.

11. The amplifier of claim 10, further including a light source for producing said light.

12. The amplifier of claim 11, wherein said light source is a laser source.

13. The amplifier of claim 10, wherein said n-doped region comprises a first higher n-doped region and a second lower n-doped region.

14. An amplifier, comprising:
a modulator for modulating a light with an input signal; and
a semiconductor device, comprising:
a substrate;
a n-doped region within said substrate;
a p-doped region within said substrate;
a channel within said substrate between said n-doped and p-doped regions, wherein a depletion region exists within said channel when a reverse bias voltage is applied across said n-doped and p-doped regions; and
a photosensitive region situated within said channel and including a portion of said depletion region when said reverse bias voltage is applied across said n-doped and p-doped regions, wherein hole-electron pairs are generated from said depletion region within said photosensitive region in response to said modulated light upon said photosensitive region; and
a series impedance element electrically coupled either to said n-doped region or p-doped region for biasing said semiconductor device, wherein said substrate is doped with p-type dopant, and the concentration of the p-type dopant in the p-doped region is greater than the concentration of the p-type dopant of the substrate.

15. The amplifier of claim 14, wherein said photosensitive region is doped with a dopant.

16. The amplifier of claim 15, wherein said dopant is a p-type dopant.

17. The amplifier of claim 14, further including a light reflecting material disposed over said channel, wherein said light reflecting material includes an opening to allow an incident light to strike said photosensitive region.

18. An amplifier, comprising:
a modulator for modulating a light with an input signal; and
a semiconductor device, comprising:
a substrate;
a n-doped region within said substrate;
a p-doped region within said substrate;
a channel within said substrate between said n-doped and p-doped regions, wherein a depletion region exists within said channel when a reverse bias voltage is applied across said n-doped and p-doped regions; and
a photosensitive region situated within said channel and including a portion of said depletion region when said reverse bias voltage is applied across said n-doped and p-doped regions, wherein hole-electron pairs are generated from said depletion region within said photosensitive region in response to said modulated light upon said photosensitive region; and
a series impedance element electrically coupled either to said n-doped region or p-doped region for biasing said semiconductor device, wherein said photosensitive region is tapered so that the resistance of the photosensitive region increases along the n-doped to p-doped region direction.

19. The semiconductor device of claim 18, further including a substantially constant resistive region within said substrate between said photosensitive region and the p-doped region.

20. An amplifier, comprising:
a modulator for modulating a light with an input signal; and
a semiconductor device, comprising:
a substrate;
a n-doped region within said substrate;
a p-doped region within said substrate;
a channel within said substrate between said n-doped and p-doped regions, wherein a depletion region exists within said channel when a reverse bias voltage is applied across said n-doped and p-doped regions; and
a photosensitive region situated within said channel and including a portion of said depletion region when said reverse bias voltage is applied across said n-doped and p-doped regions, wherein hole-electron pairs are generated from said depletion region within said photosensitive region in response to said modulated light upon said photosensitive region;
a series impedance element electrically coupled either to said n-doped region or p-doped region for biasing said semiconductor device, and
a substantially constant resistive region within said substrate between said photosensitive region and the p-doped region, wherein said resistive region is tapered so that the resistance of the resistive region increases along the n-doped to p-doped region direction.

21. A semiconductor device, comprising:
a substrate including a channel for conduction of current therethrough, wherein said channel includes a depletion region during said conduction of current; and
a photosensitive region doped with p-type dopant, said photosensitive region situated within said channel and including a portion of said depletion region during said conduction of current, wherein hole-electron pairs are generated from said portion of said depletion region within said photosensitive region in response to an incident light upon said photosensitive region;

a n-doped region within said substrate; and a p-doped region within said substrate, wherein said channel is situated between said n-doped and p-doped regions, and wherein said depletion region exists within said channel when a reverse bias voltage is applied across said n-doped and p-doped regions, wherein said substrate is doped with p-type dopant, and the concentration of the p-type dopant in the photosensitive region is greater than the concentration of the p-type dopant of the substrate.

22. The semiconductor device of claim 21, wherein said n-doped region comprises a first higher n-doped region and a second lower n-doped region.

23. A semiconductor device, comprising:

a substrate including a channel for conduction of current therethrough, wherein said channel includes a depletion region during said conduction of current; and a photosensitive region situated within said channel and including a portion of said depletion region during said conduction of current, wherein hole-electron pairs are generated from said portion of said depletion region within said photosensitive region in response to an incident light upon said photosensitive region;

a n-doped region within said substrate; and a p-doped region within said substrate, wherein said channel is situated between said n-doped and p-doped regions, and wherein said depletion region exists within said channel when a reverse bias voltage is applied across said n-doped and p-doped regions, wherein said substrate is doped with p-type dopant, and the concentration of the p-type dopant in the p-doped region is greater than the concentration of the p-type dopant of the substrate.

24. The semiconductor device of claim 23, wherein said photosensitive region is doped with a dopant.

25. The semiconductor device of claim 24, wherein said dopant is a p-type dopant.

26. The semiconductor device of claim 23, further including a light reflecting material disposed over said channel, wherein said light reflecting material includes an opening to allow an incident light to strike said photosensitive region.

27. A semiconductor device, comprising:

a substrate including a channel for conduction of current therethrough, wherein said channel includes a depletion region during said conduction of current; and a photosensitive region situated within said channel and including a portion of said depletion region during said conduction of current, wherein hole-electron pairs are generated from said portion of said depletion region within said photosensitive region in response to an incident light upon said photosensitive region;

a n-doped region within said substrate; and a p-doped region within said substrate, wherein said channel is situated between said n-doped and p-doped regions, and wherein said depletion region exists within said channel when a reverse bias voltage is applied across said n-doped and p-doped regions, wherein said photosensitive region is tapered so that the resistance of the photosensitive region increases along the n-doped to p-doped region direction.

28. The semiconductor device of claim 27, further including a substantially constant resistive region within said substrate between said photosensitive region and the p-doped region.

29. A semiconductor device, comprising:

a substrate including a channel for conduction of current therethrough, wherein said channel includes a depletion region during said conduction of current; and a photosensitive region situated within said channel and including a portion of said depletion region during said conduction of current, wherein hole-electron pairs are generated from said portion of said depletion region within said photosensitive region in response to an incident light upon said photosensitive region;

a n-doped region within said substrate; and a p-doped region within said substrate, wherein said channel is situated between said n-doped and p-doped regions, and wherein said depletion region exists within said channel when a reverse bias voltage is applied across said n-doped and p-doped regions, a substantially constant resistive region within said substrate between said photosensitive region and the p-doped region, wherein said resistive region is tapered so that the resistance of the resistive region increases along the n-doped to p-doped region direction.

30. A complimentary semiconductor device, comprising:

a first device, comprising:
a p-doped substrate;
a first n-doped region within said p-doped substrate;
a first p-doped region within said p-doped substrate;
a p-doped channel within said p-doped substrate between said first n-doped and first p-doped regions, wherein a first depletion region exists within said channel when a reverse bias voltage is applied across said first n-doped and first p-doped regions; and
a first photosensitive region comprising a relatively high p-doped region situated within said p-doped channel and partially including said first depletion region when said reverse bias voltage is applied across said first n-doped and first p-doped regions, wherein hole-electron pairs are generated from said partial first depletion region within said first photosensitive region in response to an incident light upon said first photosensitive region; and a second device, comprising:
an n-doped substrate;
a second p-doped region within said n-doped substrate;
a second n-doped region within said p-doped substrate;
a n-doped channel within said n-doped substrate between said second n-doped and second p-doped regions, wherein a second depletion region exists within said n-doped channel when a reverse bias voltage is applied across said second n-doped and second p-doped regions; and
a second photosensitive region comprising a relatively high n-doped region situated within said n-doped channel and partially including said second depletion region when said reverse bias voltage is applied across said second n-doped and second p-doped regions, wherein hole-electron pairs are generated from said partial second depletion region within said second photosensitive region in response to said incident light upon said second photosensitive region.

* * * * *